US011367734B2

(12) United States Patent
Khan et al.

(10) Patent No.: US 11,367,734 B2
(45) Date of Patent: Jun. 21, 2022

(54) CHARGE TRAP MEMORY DEVICES

(71) Applicant: GLOBALFOUNDRIES U.S. INC., Santa Clara, CA (US)

(72) Inventors: Faraz Khan, Los Angeles, CA (US); Dan Moy, Bethel, CT (US); Norman W. Robson, Hopewell Junction, NY (US); Robert Katz, Hopewell Junction, NY (US); Darren L. Anand, Williston, VT (US); Toshiaki Kirihata, Poughkeepsie, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 207 days.

(21) Appl. No.: 16/781,527

(22) Filed: Feb. 4, 2020

(65) Prior Publication Data
US 2021/0242230 A1    Aug. 5, 2021

(51) Int. Cl.
| | |
|---|---|
| *H01L 29/792* | (2006.01) |
| *H01L 27/11568* | (2017.01) |
| *G11C 16/08* | (2006.01) |
| *G11C 16/24* | (2006.01) |
| *H01L 27/11573* | (2017.01) |

(52) U.S. Cl.
CPC ........ *H01L 27/11568* (2013.01); *G11C 16/08* (2013.01); *G11C 16/24* (2013.01); *H01L 27/11573* (2013.01); *H01L 29/7923* (2013.01)

(58) Field of Classification Search
None
See application file for complete search history.

(56) References Cited

U.S. PATENT DOCUMENTS

| | | | |
|---|---|---|---|
| 6,009,033 A | 12/1999 | Li et al. | |
| 9,025,386 B1 | 5/2015 | Iyer et al. | |
| 9,208,878 B2 | 12/2015 | Iyer et al. | |
| 10,685,705 B2* | 6/2020 | Khan | G11C 11/5671 |
| 2004/0041206 A1 | 3/2004 | Bhattacharyya | |
| 2004/0041208 A1 | 3/2004 | Bhattacharyya | |
| 2010/0066438 A1* | 3/2010 | Siprak | H01L 21/761 |
| | | | 327/535 |
| 2012/0281478 A1* | 11/2012 | Lue | H01L 27/11578 |
| | | | 365/185.18 |
| 2013/0087327 A1* | 4/2013 | Nguyen | G01K 7/343 |
| | | | 166/250.01 |
| 2014/0198551 A1 | 7/2014 | Louie et al. | |

(Continued)

OTHER PUBLICATIONS

Taiwanese Notice of Allowance dated Sep. 15, 2020 in related TW application 108122165, 4 pages.

(Continued)

*Primary Examiner* — Xiaoming Liu
(74) *Attorney, Agent, or Firm* — Michael Le Strange; Andrew M. Calderon; Roberts Calderon Safran & Cole, P.C.

(57) ABSTRACT

The present disclosure generally relates to semiconductor structures and, more particularly, to charge trap memory devices and methods of manufacture and operation. The semiconductor memory includes: a charge trap transistor comprising a gate structure, a source region and a drain region; and a self-heating circuit which selectively applies an alternating bias direction between the source region and the drain region of the charge trap transistor to provide an erase operation or a programming operation of the charge trap transistor.

20 Claims, 11 Drawing Sheets

(56) References Cited

U.S. PATENT DOCUMENTS

2020/0035295 A1     1/2020    Khan et al.
2021/0296338 A1*   9/2021    Han .................. G11C 5/06

OTHER PUBLICATIONS

Taiwanese Office Action dated May 29, 2020 in related TW application 108122165, 8 pages.

Faraz Khan et al., "Charge Trap Transistor (CTT): An Embedded Fully Logic-Compatible Multiple-Time Programmable Non-Volatile Memory Element for High-k-Metal-Gate CMOS Technologies," IEEE Electron Device Letters ,vol. 38, pp. 44-47, Jan. 2017.

Specification and Figures for related U.S. Appl. No. 16/047,529, filed Jul. 27, 2018.

Balaji Jayaraman et al., "80-kb Logic Embedded High-K Charge Trap Transistor-Based Multi-Time-Programmable Memory With No Added Process Complexity", IEEE Journal of Solid-State Circuits, vol. 53, No. 3, Mar. 2018, pp. 949-960.

Faraz Khan et al., "The Impact of Self-Heating on Charge Trapping in High-k-Metal-Gate nFETs", IEEE Electron Device Letters, vol. 37, No. 1, Jan. 2016, pp. 88-91.

Faraz Khan et al., "Charge Trap Transistor (CTT): An Embedded Fully Logic-Compatible Multiple-Time Programmable Non-Volatile Memory Element for High-k-Metal-Gate CMOS Technologies", IEEE Electron Device Letters, vol. 38, No. 1, Jan. 2017, pp. 44-47.

Yuh-Te Sung et al., "A New Saw-Like Self-Recovery of Interface States in Nitride-Based Memory Cell", IEDM, 2014, pp. 494-497.

German Office Action issued in Application No. DE102019209317.5 dated Feb. 23, 2021, 12 pages. (Concise Explanation of Relevance attached).

Taiwanese Office Action dated Sep. 11, 2021 in related TW application 110100088, 11 pages.

\* cited by examiner

CHARGE TRAP MEMORY DEVICES

FIELD OF THE INVENTION

The present disclosure generally relates to semiconductor structures and, more particularly, to charge trap memory devices and methods of manufacture.

BACKGROUND

In Charge Trap Transistor (CTT) technologies, N-type high-k metal gate (HKMG) Metal-Oxide-Semiconductor Field-Effect Transistors (MOSFETs) can be used as multi-time programmable memory (MTPM) elements, resulting in a zero-process-adder and zero-mask-adder solution for embedded non-volatile memory applications. Programming can be achieved by electron injection into the high-k dielectric of the N-type MOSFET, with an elevated gate voltage ($V_g$) and a relatively high drain bias (e.g. 1.5V—deep-on state of the N-type MOSFET). The memory element can be erased by applying a negative gate-to-drain voltage and/or a negative gate-to-source voltage with a magnitude more than 2.5V (a deep-OFF state of the N-type MOSFET), such that the injected electrons are released from the high-k dielectric material of the transistor.

Erase operations in CTT memory devices can lead to insufficient erase, limiting the endurance for a Multi-Time-Programmable-Memory (MTPM) to <10× program/erase cycles. Further, devices which attempt to address CTT erase operations have relatively high-power consumption. Additionally, these devices can have a high current flow in the same direction for both program and erase operations, which causes metal (e.g., tungsten (W)), migration as well as time-dependent dielectric breakdown (TDDB) concerns, due to a relatively high field on one side of the device. Furthermore, during current program operations, the memory window can be limited due to charge trap saturation.

SUMMARY

In an aspect of the disclosure, a semiconductor memory comprises: a charge trap transistor comprising a gate structure, a source region and a drain region; and a self-heating circuit which selectively applies an alternating bias direction between the source region and the drain region of the charge trap transistor to provide an erase operation or a programming operation of the charge trap transistor.

In an aspect of the disclosure, a semiconductor memory cell comprises: a charge trap transistor comprising a plurality of source regions and a drain region and a plurality of doped wells; and a self-heating circuit is configured to selectively apply a bias in a first direction and a second, reverse direction to the source regions and the drain region to assist in an erase operation or a program operation of the charge trap transistor.

In an aspect of the disclosure, a semiconductor memory cell comprises: a Metal-Oxide-Semiconductor Filed-Effect Transistor (MOSFET) comprising a substrate, a gate structure, a high-k dielectric material under the gate structure, a source region and a drain region; and a self-heating circuit is configured to apply a bias to the substrate, the high-k dielectric metal gate structure, the source region and the drain region, wherein the high-k dielectric of the high-k dielectric metal gate structure releases a trapped charge when a bias direction applied to the MOSFET is alternated between the source region and the drain region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
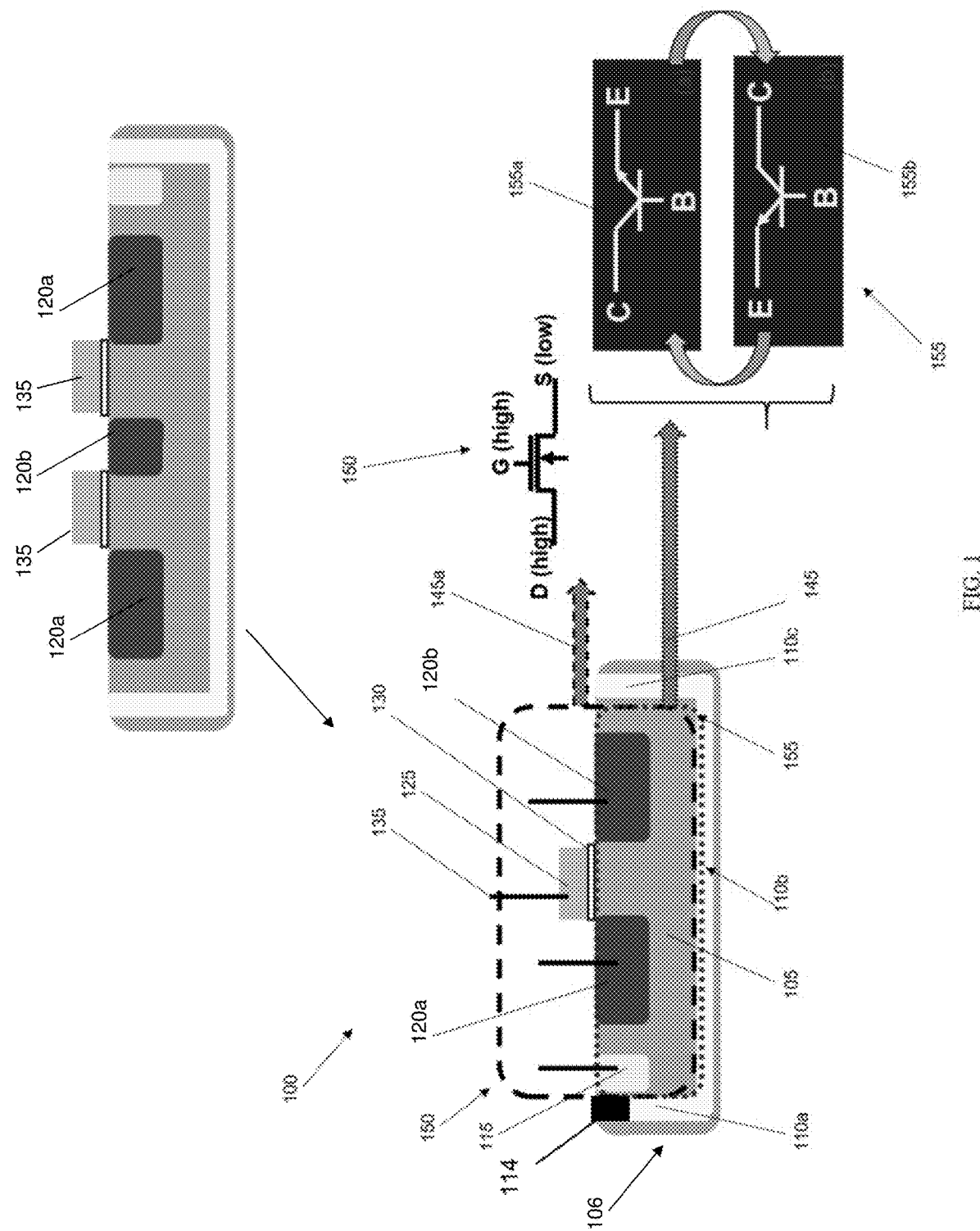
FIG. 1 shows a CTT memory structure utilizing a source-substrate-drain structure of the device as a parasitic (n-p-n) bipolar junction transistor (BJT), amongst other features, in accordance with aspects of the present disclosure.

The present disclosure generally relates to semiconductor structures and, more particularly, to charge trap memory devices and methods of manufacture. More specifically, the present disclosure relates to a reverse self-heating temperature assisted erase in charge trap transistor memories. The present disclosure also provides a method of improving endurance and reliability in multi-time programmable charge trap memory devices using the self-heating assisted erase. Advantageously, the structures and processes described herein enable a charge trap transistor (CTT) Multi-Time-Programmable-Memory (MTPM) with a program/erase endurance >1000×, amongst other advantages and benefits described herein.

In embodiments, the methods and structures described herein improve programming and erasing operations in a charge trap transistor (CTT) memory cell by self-heating of the channel region of an N-type MOSFET using a current of a bipolar junction transistor (BJT) with the source, the drain and the substrate of the MOSFET acting as an emitter, a collector and a base, respectively. In more specific embodiments, a n-doped source acts as an emitter node, a p-doped substrate acts as a base node, and a n-doped drain acts as a collector node. The n-diffusion of the source can also be used as a collector node while the n-diffusion of the drain can be used as an emitter node. Accordingly, the source-substrate-drain of the CTT device can be used as a parasitic (n-p-n) BJT for self-heating temperature enhanced erase operations while the current is flowing in alternating directions.

The structures and processes described herein alternate the bias direction between the source (emitter) and the drain (collector) for both program and erase operations. In embodiments, during a program operation, electrons are trapped within a gate dielectric of the CTT device. Alternatively, for an erase operation, the trapped electrons within the gate dielectric are de-trapped. Illustratively, for the erase operation, the structures and processes described herein reverse the drain (collector) and source (emitter) bias, i.e., drain=low and source=high for erase operations; whereas, for programming operations, the drain=high and source=low. This results in a significant reduction in the n-p-n current. In addition, this has several advantages, amongst others: (i) tungsten (W) migration is mitigated by alternating direction of electron flow, improving yield; (ii) the erase efficiency and reliability is improved due to a more uniform erase; and (iii) the risk of breakdown due to the gate-to-drain bias is reduced as the high bias is now shared between gate-drain and gate-source due to the alternating bias. Moreover, gate dielectric breakdown probability (caused by time dependent dielectric breakdown (TDDB)) is reduced due to reduced high voltage stress time. Other intrinsic parameters such as current and gate leakages are also benefitted.

In addition to improving erase operations, programming operations are improved by allowing for a trapping of the electrons more uniformly in the high-k dielectric of the N-type MOSFET. Specifically, electrons are more effectively trapped by using a deep ON state of the N-type MOSFET by raising source and drain alternatively (using an elevated gate voltage and high drain or source voltage) in combination with the self-heating effect described herein. (It should be understood by those of ordinary skill in the art that an operational principle of programming the CTT device includes a high channel current which leads to an elevated bitcell temperature, which significantly increases the charge injection efficiency.) Due to the improved efficiency, the programming operation can be performed using a lower elevated gate voltage, thereby reducing a device breakdown risk. Additionally, during the program operation, the signal margin can be significantly improved by inducing trapping on both sides of the device. This larger signal provides for improved product reliability and enhanced program efficiency.

FIG. 1 shows a CTT memory structure utilizing a source-substrate-drain as a parasitic (n-p-n) bipolar junction transistor (BJT), amongst other features, in accordance with aspects of the present disclosure More specifically, the CTT memory structure 100 includes a transistor 150. In embodiments, the transistor 150 is a N-type-Metal-Oxide-Semiconductor Field-Effect-Transistor (N-type MOSFET) utilized as a charge trap transistor (CTT), which enables a bipolar junction transistor (BJT) self-heating function to improve programming and erase efficiency within an embedded non-volatile memory (eNVM). For example, by using the BJT it is possible to employ self-heating processes in a channel region of a gate structure in which current will flow from the drain to the source (of the N-type MOSFET) and vice versa, while also enabling a deep-off state of the MOS transistor of the cell. The structures herein also enable a partially-deep-OFF state of the N-type MOSFET.

More specifically, the CTT memory structure 100 includes a substrate 105 which is composed of any suitable material including, but not limited to, Si, SiGe, SiGeC, SiC, GaAs, InAs, InP, etc. In embodiments, the substrate 105 can be a lightly p-doped substrate. A transistor (e.g., N-type MOSFET structure) 150 is formed on the substrate 105 and includes a gate structure 125, a n-doped diffusion source region 120*a*, and a n-doped diffusion drain region 120*b*. Generally, the CTT memory structure 100 uses an even number (preferably two) of fingered transistor FET cells, where the edge of the fingered FET cells are assigned to the source 120*a*, and the shared diffusion is assigned to the drain 120*b*. Generally, for programming, the drain 120*b* and the source 120*a* are high and low, respectively.

The gate structure 125 includes gate material and gate dielectric material 130 formed on the substrate 105. The gate structure 125 can be fabricated using any known gate formation processes, e.g., replacement gate fabrication processes or gate first processes as is known in the art. In embodiments, the gate structure 125 is a metal with different work function metals deposited on a high-k dielectric material 130. For example, the gate dielectric material 130 can be hafnium-based dielectrics. In further embodiments, the high-k dielectric materials can include, but are not limited to: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

The CTT memory structure 100 can be a n-p-n BJT structure 155 using the N-type MOSFET's n-doped diffusion source region 120*a* as an emitter, the n-doped diffusion drain region 120*b* as a collector and the p-doped substrate (hereinafter referred to as "p-well") 105 as a base. More specifically, a forward biasing of the p-well 105, the source, i.e., source region 120*a*, and the drain, i.e., drain region 120*b*, allows for the source to act as an emitter and the drain to act as a collector of a bipolar junction transistor (BJT), i.e., n-p-n BJT structure 155. In embodiments, a triple well, i.e., n-wells 110*a*, 110*c*, and the n-plate 110*b*, isolates the p-well 105 from the p-doped bulk substrate 106 for biasing. In this way, the source, i.e., source region 120*a*, and the drain, i.e., drain region 120*b*, are n-doped and the p-well 105 is p-doped to form an n-p-n junction transistor, i.e., n-p-n BJT structure 155.

The CTT memory structure 100 further includes a p-doped diffusion coupling to the p-well 115 to isolate the p-well 105 from the p-doped bulk substrate 106 used for other circuitries. The isolated p-well 115 is realized by using deep n-wells 110*a* and 110*c* in a perimeter of the p-well 115, and n-plate 110*b* at the bottom of the p-well 105. The n-wells 110*a*, 110*c*, and the n-plate 110*b* are deeply implanted with an n-type species, e.g., phosphorus, which are biased at higher voltage than the p-well using n doped diffusion 114. This allows the p-well 105 or a base of the n-p-n BJT structure 155 to be biased to the target voltage without effecting other circuits using the p-doped bulk substrate 106.

Contacts 135 extend to the source region 120*a*, the drain region 120*b*, and the gate structure 125, respectively. The contacts 135 coupling to the p-doped diffusion 115 are utilized to selectively apply voltages to the p-well 105. The contacts 135 coupling to the n-doped diffusion 114 are utilized to apply voltages to isolate the p-well 105 from the bulk p-substrate as discussed previously.

Table 1 summarizes the voltage conditions for self-heated erase operation 145 and programming operation 145*a* as described herein. It should be understood by those of skill in the art that the values shown in FIG. 1 are merely illustrative values and are not limiting, in any way. For example, different values can be used based on desired device performance characteristics, materials used, etc.

TABLE 1

| Condition Mode | G (WL in the array) | D/C (PL in the array) | S/E (BL in the array) | SUB/B (SUB in array) | N-type MOSFET | BJT |
|---|---|---|---|---|---|---|
| Heated Erase | 0 (1st low Voltage) | Alternate between 2.2 (1st high Voltage) and 0 (2nd low Voltage) | Alternate between 0 (2nd low Voltage) and 2.2 (1st high Voltage) | 2.2 (2nd high Voltage) | OFF | ON |
| Heated Program | 2.0 (3rd high Voltage) | Alternate between 0 (3rd low Voltage) and 1.6 (4th high Voltage), where the order of high/low voltage application is opposite to that of the Erase. | Alternate between 1.6 (4th high Voltage), and 0 (3rd low Voltage), were the order of high/low voltage application is opposite to that of the Erase. | 1.6 (2nd high Voltage) | ON | ON |

Unlike known erase operations using a deep-OFF state of the N-type MOSFET, erase operation 145 described herein has the drain region (D/C) 120b set to alternate between 2.2V (1st high Voltage) and 0 (2nd low Voltage) at step 155a, while the source region 120a (S/E) 120a is set to alternate between 0 (2nd low Voltage) and 2.2 (1st high Voltage) at step 155b. In embodiments, the gate structure 125 is set at the 1st low voltage. In further embodiments, the 1st and 2nd high voltages may be the same and preferably set at 2.2V, and the 1st and 2nd low voltages may be the same, and preferably set at 0V.

Alternating the voltage applied to the p-well 105 between 0 (2nd low Voltage) and 2.2 (1st high Voltage) will turn on the p-n junction coupling to the p-well 105 and the n-doped diffusion source region 120a, which further enables a n-p-n BJT current from the n-doped drain region 120b to 0V for the n-doped diffusion source region 120a. This is due to the fact that the n-doped diffusion source region 120a, the p-well 105, and n-doped drain region 120b of the N-type MOSFET act as emitter, base, and collector for the BJT structure 155, respectively. In operation, the current flowing from the drain region 120b to the source region 120a and the p-well 105 to the source region 120a will self-heat the channel region beneath the gate structure 125 and the gate dielectric material 130, thereby increasing the efficiency of erase operations 145 and program operations 145a.

As an exemplary erase operation 145, the transistor 155 is in a deep OFF (accumulation) mode by keeping the gate structure 125 at the 1st low voltage (0V) and the p-well 105 at the 2nd high voltage (~2.2V) and alternating between conditions 155a and 155b. In embodiments, conditions 155a and 155b are defined as follows: (a) at condition 155a, the drain (D) 120b is raised to the 1st high voltage (~2.2V) while the source (S) 120a is at 2nd low voltage (0V); and (b) at condition 155b, the source (S) 120a is raised to the 1st high voltage (~2.2V) while the drain (D) 120b is at 2nd low voltage (0V).

Employing self-heating using the parasitic bipolar n-p-n transistor 155 with the source (emitter) 120a, the drain (collector) 120b and the p-well (base) 105 in the CTT memory cell, while simultaneously enabling a deep-OFF state of the transistor of the cell, allows for an erase operation to be performed. Further, by alternating the bias direction between the source (emitter) 120a and drain (collector) 120b at conditions 155a and 155b, several advantages can be achieved including: (i) W migration being mitigated, thereby improving the yield drastically; (ii) erase efficiency and reliability being improved due to a more uniform erase; and (iii) a risk of breakdown due to the gate-to-drain bias being reduced as the high bias is now shared between gate-drain and gate-source due to the alternating bias of conditions 155a and 155b for de-trapping of the electrons during the erase operation 145.

During an exemplary programming operation 145a, the voltage of the gate structure 125 is raised to a 3rd high voltage (~2V), while the drain region (D/C) 120b alternates between 0V (3rd low Voltage) and 1.6V (4th high Voltage), where the order of high/low voltage application is opposite to that of the erase operation discussed above. Further, the source region (S/E) 120a alternates between 1.6V (4th high Voltage), and 0V (3rd low Voltage), where the order of high/low voltage application is opposite to that of the erase operation. The current with the gate voltage ($V_g$) at a 3rd high voltage (2V) attracts the electrons and pulls them into the gate dielectric 130. Optionally, when the p-well (S/B) 105 is raised to the 2nd high voltage (1.6V), the n-p-n BJT current flows from the drain region (Drain/Collector (D/C)) 120b to the source region (Source/Emitter (S/E)) 120a, and the p-well (Substrate/Base (SUB/B)) 105 to source region (S/E) 120a. This n-p-n BJT current self-heats the channel region of the N-type MOSFET, thereby improving the electron trapping efficiency, i.e., the programming efficiency.

Specifically, the heating of the channel region heats the gate dielectric 130, causing the charges to be trapped within the gate dielectric 130 during the program operation. This is due to the charges being able to move into the gate dielectric 130 easier as compared to when the channel region is not heated, i.e., without using the n-p-n BJT current. Because of this self-heating assist, the gate voltage for programming (3rd high voltage) can be reduced, in turn reducing the device breakdown risk and reducing programming time. Further, the breakdown issue is mitigated by alternating the direction of channel current flow, in addition to the electric field, during the programming operation.

Figure 2A:
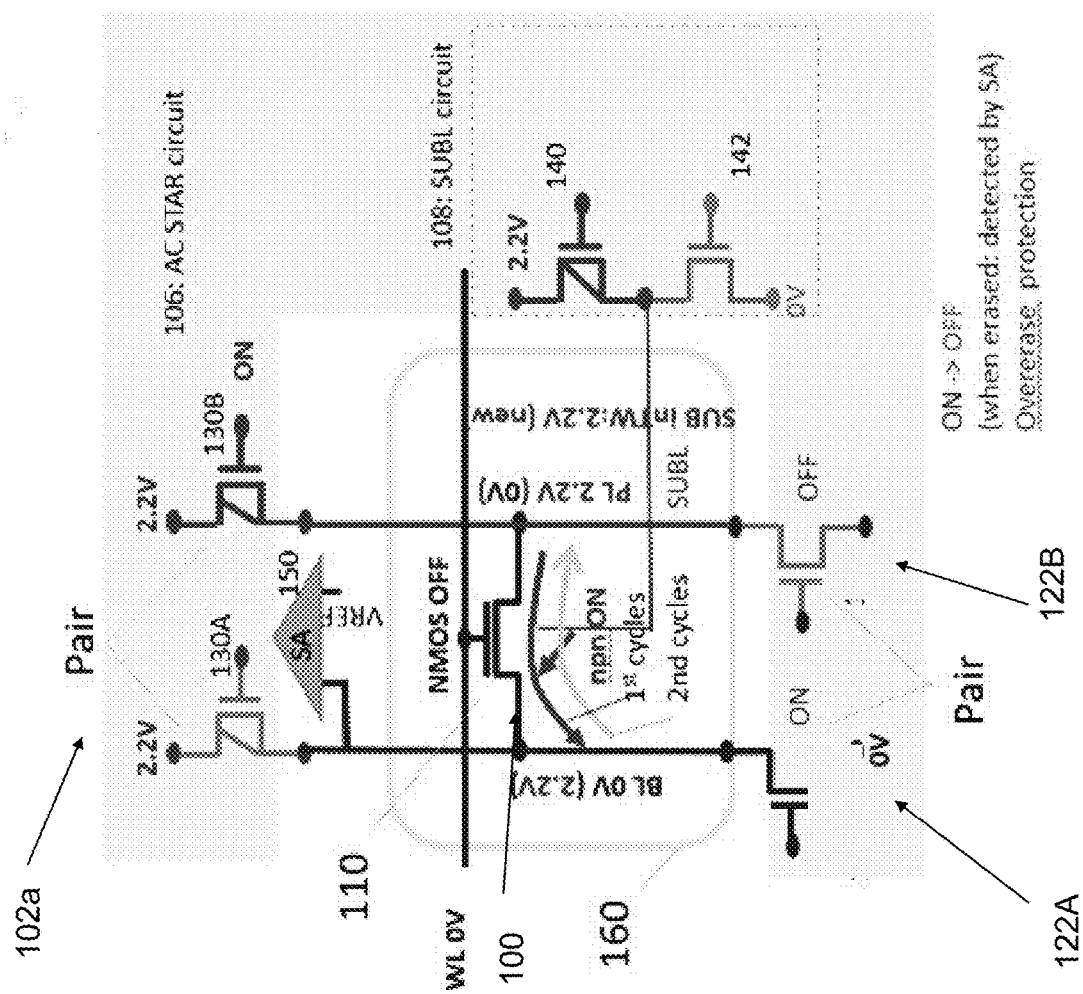
FIGS. 2A-4B show various memory cells and respective control circuitry for erase and program operations of the CTT memory structure of FIG. 1, in accordance with aspects of the present disclosure.
Figure 2B:
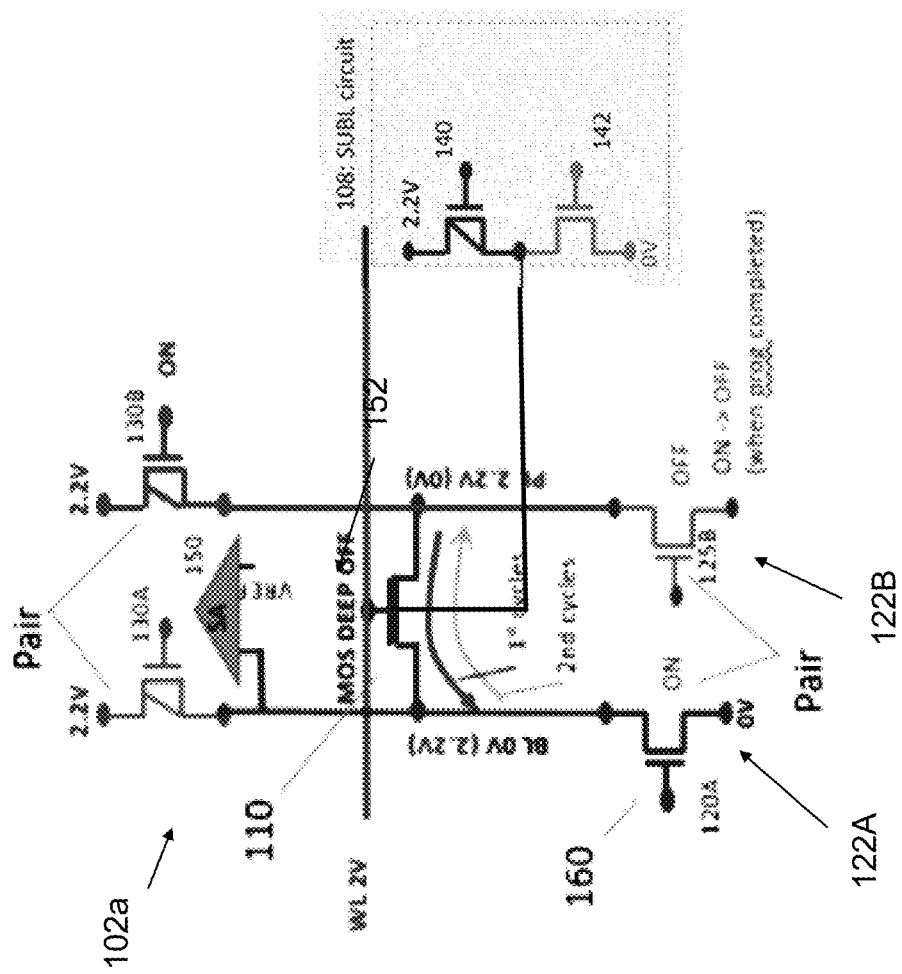

FIGS. 2A and 2B illustrate circuit 102a for erase operations and circuit 102b for program operations which implement memory cells with self-heating assist according to aspects of the present disclosure. Specifically, the features of the circuits 102a, 102b can apply the currents and voltages discussed in the examples of FIG. 1 through the self-heating circuit 102a and 102b.

In embodiments, the CTT memory structure 100 is controlled by use of bitline (BL), wordline (WL), programming-line (PL), and substrate-line (SUB) structures, all coupled to the contacts 135 of the p-well (SUB/B) 105, the source region (S/E) 120a, the drain region (D/C) 120b, and the gate structure (G) 125 as shown in FIG. 1. Specifically, the BL is coupled to the source region 120a, the programming-line (PL) is coupled to the drain region (D/C) 120b, the WL is coupled to the gate structure (G) 125, and the SUB line is coupled to the p-well (Substrate/Base (SUB/B)) 105 through the p-doped diffusion 115. In this way, the structures and processes described herein provide a charge trap transistor, i.e., the CTT memory structure 100, and a self-heating circuit 102*a* which selectively applies voltages to terminals of the charge trap transistor 100 to assist in erase operations of the charge trap transistor. The charge trap transistor 100 is arranged in the isolated p-well 160 such that p-well plate (substrate of the CTT memory structure 100) can be controlled without affecting other bulk p-substrates for other circuits.

More specifically, trapped charges of the CTT memory structure 100 are removed by raising Substrate-Line (SUBL) to the high voltage (~2.2V) by using the transistors 140, 142 of the SUBL circuit 108, with the self-heating circuit 102*a* including bit line (BL) switch transistors 122A, 130A and programming-line (PL) switch transistors 122B, 130B for pulling the BL and the PL down and up for the 1st cycle using the corresponding NMOS transistor 122A and PMOS transistor 130B, respectively, and pulling PL and BL down and up using the corresponding NMOS transistor 122B and PMOS transistor 130A for the 2nd cycle, respectively. In this way, a current direction of the BJT self-heating is changed during erase operation 145. In embodiments, the circuit 102*a* includes a circuit to stop the pull-up and down operation when sense amplifier 152 detects the target erase value to avoid an over-erase condition.

FIG. 2B illustrates circuit 102*b* for programming operations in memory cells with a self-heating assist approach. Specifically, the features of the circuit 102*b* apply the currents and voltages discussed in the examples of FIG. 1. More specifically, the self-heating circuit 102*b* includes the PL switch transistor 130B to raise the voltage of the PL to the 4th high voltage. In embodiments, the CTT memory structure 100 has the drain 120*b*, the source 120*a*, the gate 125, and the p-well (NMOS substrate) 105 coupled to a BL, a PL, a WL and a substrate-line (SUBL). In embodiments, the CTT memory structure 100 traps the charges during the programming operation by raising the WL to a high voltage, and pulling the BL down and the PL up using the NMOS transistor 122A and PMOS 130B for the 1st cycle and pulling PL down and BL up using NMOS transistor 122B and PMOS transistor 130A for the 2nd cycle such that the charges are trapped in the channel more uniformly.

In embodiments, 1st and 2nd cycles of the program operation are issued every other cycle. In this way, in the programming operation, the self-heating circuit 102*b* more uniformly traps the electrons to a gate dielectric 130 of source and drain sides of the charge trap transistor, i.e., CTT memory structure 100, by using an ON state of the charge trap transistor, i.e., CTT memory structure 100. More specifically, the CTT memory structure 100 is programmed by trapping the electrons in the gate dielectric material. During this operation, the p-well substrate should be 0V. Optionally, the p-well coupling to the SUBL (not shown in FIG. 2B) can be high to turn on the BJT device as discussed in FIG. 2A such that BJT current also contributes to the self-heating for programming operation.

FIGS. 3A-4B illustrate multiple CTT memory cells which can be implemented in an array in accordance with aspects of the present disclosure. The multiple CTT transistors can be arranged in a plurality of columns controlled by the corresponding BLs and PLs, with one row coupling to the WL. Further, the structures and processes described with respect to FIGS. 1-2B are analogous to the structures and processes described in FIGS. 3A-4B. For example, in FIG. 3A, the CTT transistors 210, i.e., the CTT memory structure 100, are arranged as a plurality of columns controlled by a corresponding pair of bitline (BL) and programming-line (PL) for each column, in addition to the wordline (WL) and the substrate line (SUBL), where the one of the 220 CTT devices (210S) is selected for operation.

In the circuit 202*a*, for example, the erase operation can be performed by having trapped charges of the CTT transistor 210S (selected CTT) removed by raising the substrate line (SUBL) to the high voltage (~2.2V) by using the transistors 240 (ON), 242 (OFF) of the SUBL circuit 208, while keeping WL at 0V. Further, for the erase operation, for each selected column, the BL and PL are pulled down and up for the 1st cycles using the corresponding NMOS transistor 220A and PMOS transistor 230B, respectively, and pulling the PL and BL down and up using the corresponding NMOS transistor 220B and PMOS transistor 230A for the 2nd cycle, respectively. For unselected columns, the trapped charges of the CTT transistor 210 (unselected CTT) are maintained by floating the corresponding BL and PL using the corresponding NMOS transistor 220B and PMOS 230A transistor OFF states. Similar to p-well 105 of FIG. 1, the p-well substrate 260 is created in a triple well to isolate it from other circuits sharing the same bulk substrate 106. In embodiments, the circuit 202*a* includes a circuit to stop the pull-up and down operation when the sense amplifier 250 detects an exception to the target erase value to avoid an over-erase condition.

Figure 3A:
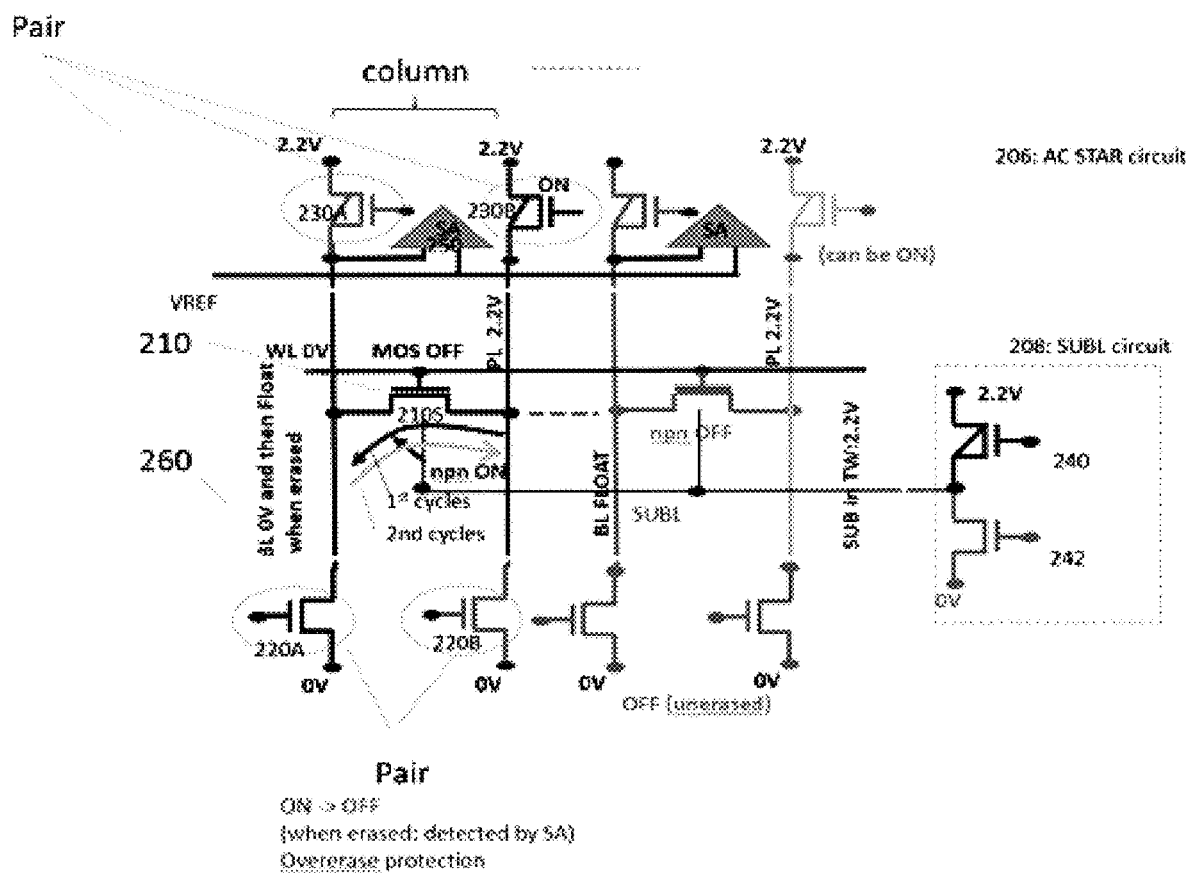
Figure 3B:
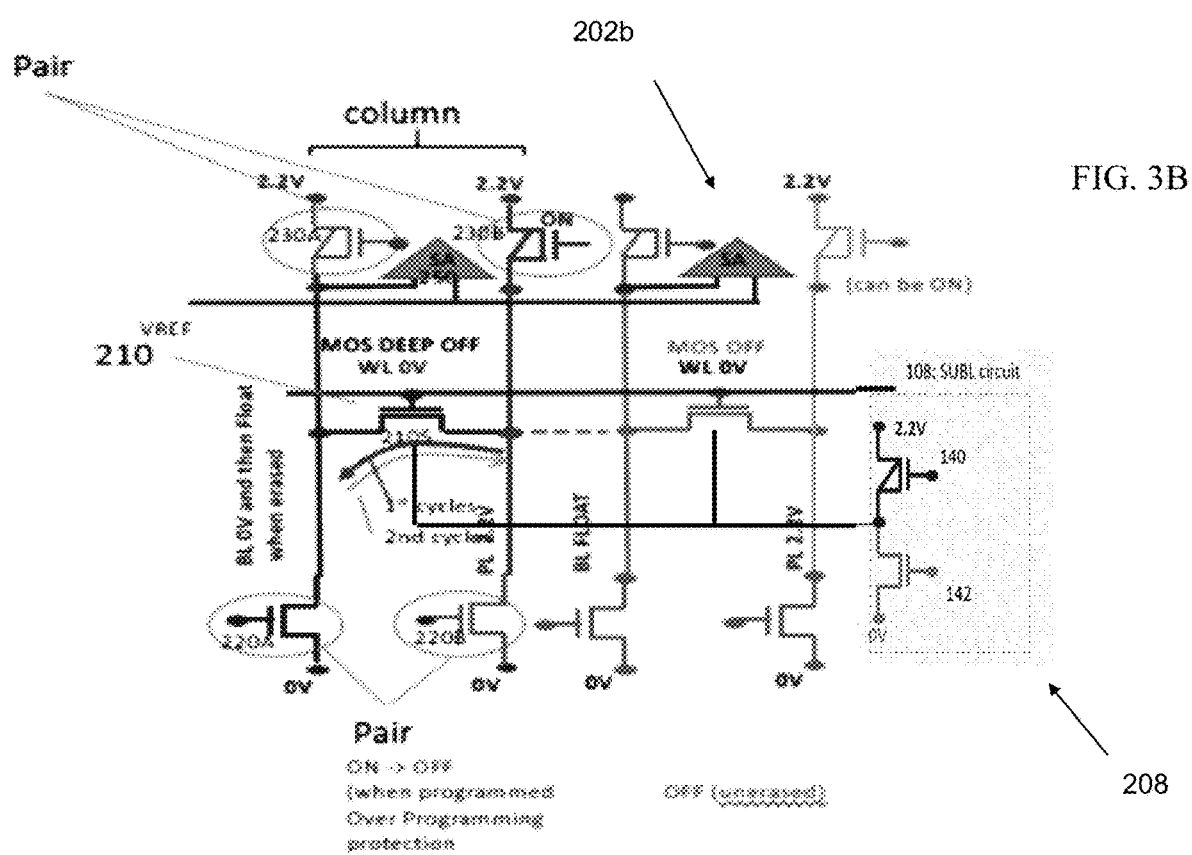

FIG. 3B shows a circuit 202*b* for the program operation. In embodiments, the CTT transistor 210 for the target cell 210S traps the charges by raising the WL to a high voltage, and for programming of the target cell 210*s*, selectively pulling the BL down and the PL up using NMOS transistor 220A and PMOS transistor 230B for the 1st cycle, and selectively pulling the PL down and the BL up using the NMOS transistor 220B and PMOS transistor 230A for the 2nd cycle. In this way, the charges are trapped in the channel of the target selected column more uniformly. Similar to circuit 202*a*, the circuit 202*b* includes a circuit to stop the pull-up and pull-down operation when the sense amplifier 250 detects a specific target programming value, in order to avoid an over-programming condition. During this programming operation, the p-well substrate should be 0V. Optionally, SUBL node using circuit 208 can be high during programming such that the additional BJT current also contributes to the self-heating for programming.

Figure 4A:
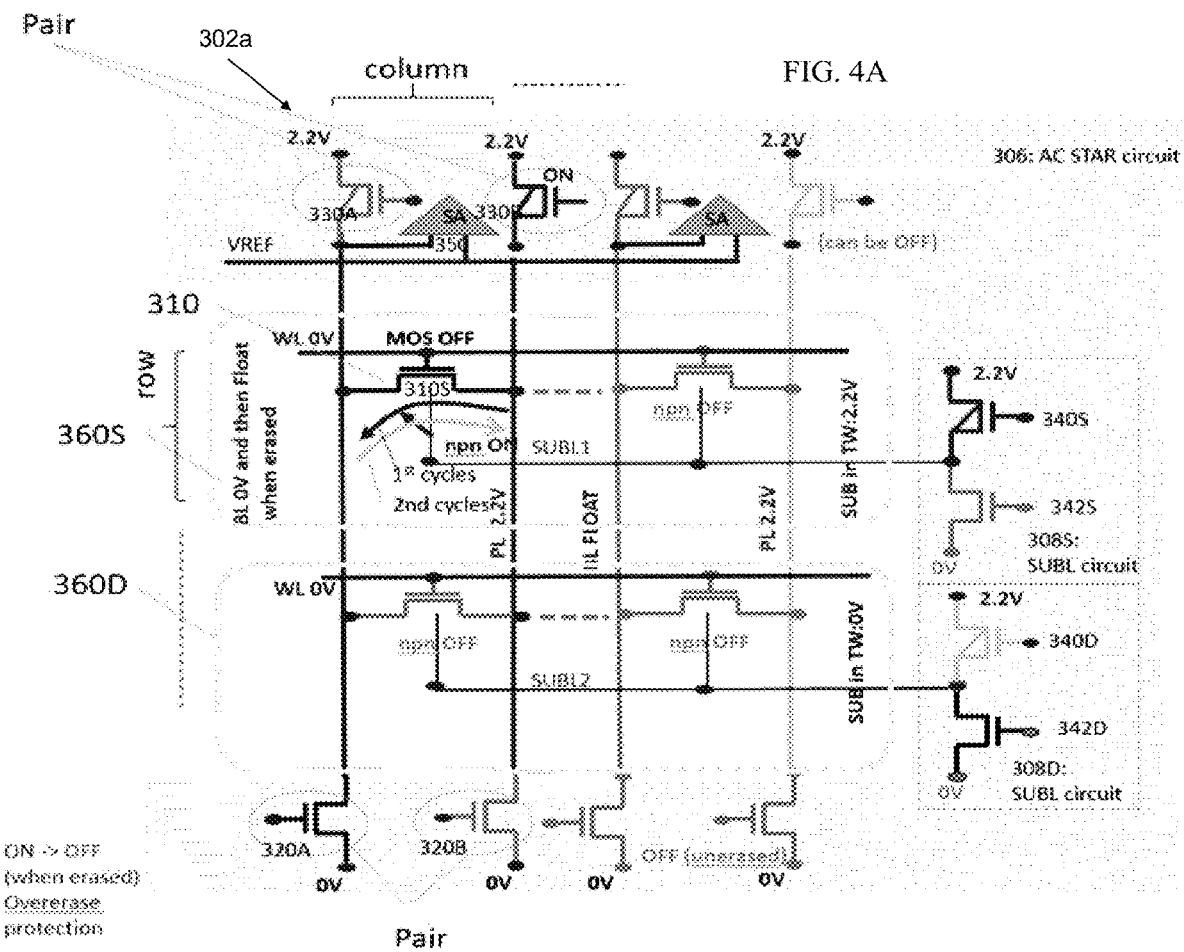

FIG. 4A shows a circuit 302*a* for the erase operation. In embodiments, the CTT transistors 310, i.e., the CTT memory structure 100, are arranged in a plurality of columns and a plurality of rows for a 2-dimensional array structure, where reference numeral 310S is the selected CTT for the erase operation, and reference numeral 310 in the array represents unselected and keep the programming states. Each column is controlled by a corresponding pair of BL and PL, while each row is controlled by a corresponding WL and substrate line (SUBL). During the erase operation, trapped charges of the CTT transistor 310S (selected CTT device) are removed by raising the substrate line (SUBL1) to a high voltage (~2.2V) by using transistors 340S, 342S of the SUBL circuit 308S, while keeping the WL at 0V. Further, for a selected column, pulling the BL and the PL down and up for the 1st cycle using the corresponding NMOS transistor 320A and PMOS transistor 330B respectively, and pulling the PL and BL down and up using the corresponding NMOS transistor 320B and PMOS transistor 330A for the 2nd cycle, respectively. For unselected columns, the trapped charges of the CTT transistor 310 (unselected CTT) are maintained by floating the corresponding BL and PL using the corresponding NMOS transistor 320B and PMOS transistor 330A OFF states, with the trapped charges for unselected rows of the CTT transistors 310 being maintained, while keeping SUBL2 at GND by using transistors 340D, 342D of the SUBL circuit 308D. The circuit 302a includes a circuit to stop the pull-up and pull-down operation when the sense amplifier 360 detects the target erase to avoid an over-erase condition.

Figure 4B:
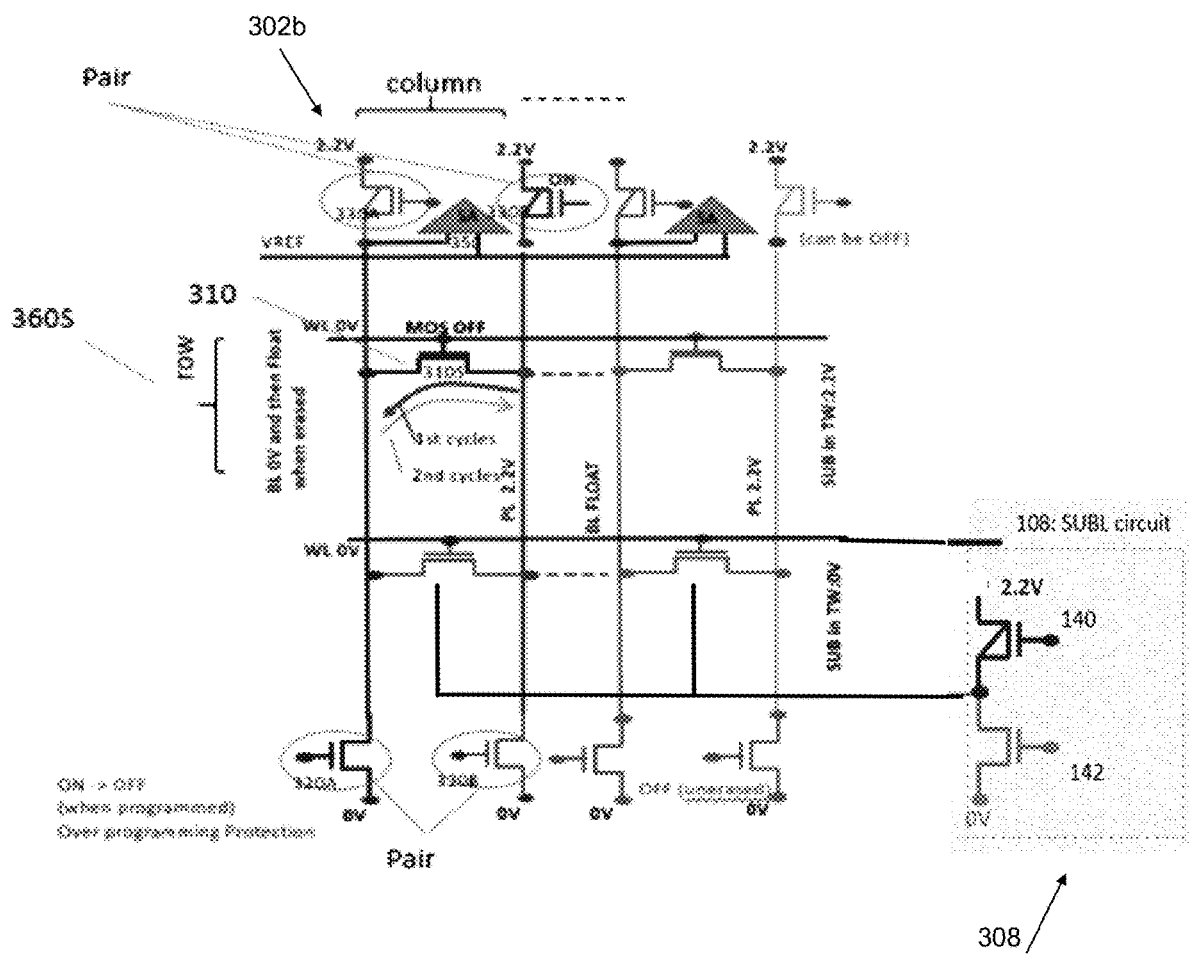

FIG. 4B shows a circuit 302b for the program operation. In embodiments, the CTT transistors 310 are arranged in a 2D matrix, where the gate of the CTT transistors 310 in the same row are coupled to a corresponding wordline (WL), and the CTT transistors 310 in the same column have their drains and sources coupled to the BL and the PL in the corresponding column. For the program operation 145a (FIG. 1), the CTT transistor 310 for the target cell 310S traps the charges by selectively raising the WL to a high voltage, and for each column, selectively pulling the BL down and the PL up using the NMOS transistor 320A and PMOS transistor 330B for the 1st cycle, and selectively pulling the PL down and the BL up using NMOS transistor 220B and the PMOS transistor 330A for the 2nd cycle, such that the charges are trapped in the channel of the target CTT transistors 310 selected by a row and a column more uniformly. The circuit 302b includes a circuit to stop the pull-up and the pull-down operation when the sense amplifier 250 detects an exception to the target programming value to avoid an over-programming condition. During this operation, all p-well substrates should be 0V. Optionally, the p-well substrate for the selected row, while keeping all other unselected p-well substrates at 0V, may be high such that BJT current is applied for the target selected CTT (310S) for effective programming.

It should be understood that the voltages discussed in FIGS. 1-4B and Table 1 are exemplary and are not intended to be limiting. For example, a P-type MOSFET may be used as a charge trap transistor (CTT) and a p-n-p BJT may be used for the self-heating assist. More specifically, the source region 120a can be a p-doped diffusion source region, the drain region 120b can be a p-doped diffusion drain region and the p-well 105 can be a n-doped substrate. In this way, the structures and processes described herein can be applied for P-type MOSFETs. More specifically, the source, i.e., source region 120a, and the drain, i.e., drain region 120b, are p-doped and the p-well 105 is n-doped to form a p-n-p junction transistor. In this way, the self-heating circuit 210a provides the self-heating effect due to an n-p-n or p-n-p BJT current flowing from the drain, i.e., drain region 120b, to the source, i.e., source region 120a, using a diffusion of the source, i.e., source region 120a, as an emitter node, the p-well 105 and a diffusion of the drain, i.e., drain region 120b, as a collector node of the charge trap transistor i.e., CTT memory structure 100, to de-trap the electrons that are trapped in the gate dielectric 130.

Moreover, it should be understood that the voltages may be increased or decreased depending on the materials being used, e.g., the gate dielectric material 130. Specifically, the voltages should be below values which would cause dielectric breakdown, while also enabling sufficient self-heating during erase, programming, or both. In this way, it is possible to significantly reduce time-dependent dielectric breakdown (TDDB) while still being able to trap a sufficient charge in the device to shift its threshold. For example, the voltages are high enough to trap charges but low enough to not cause dielectric breakdown.

Figure 5A:
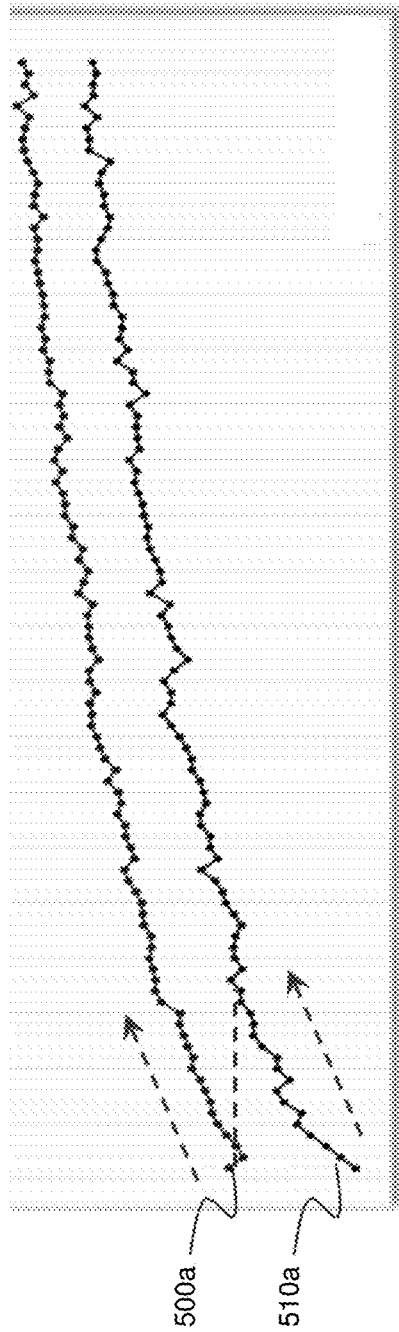
FIGS. 5A and 5B illustrate the results of program/erase cycles of a known approach and the self-heating approaches in accordance with aspects of the present disclosure.
Figure 5B:
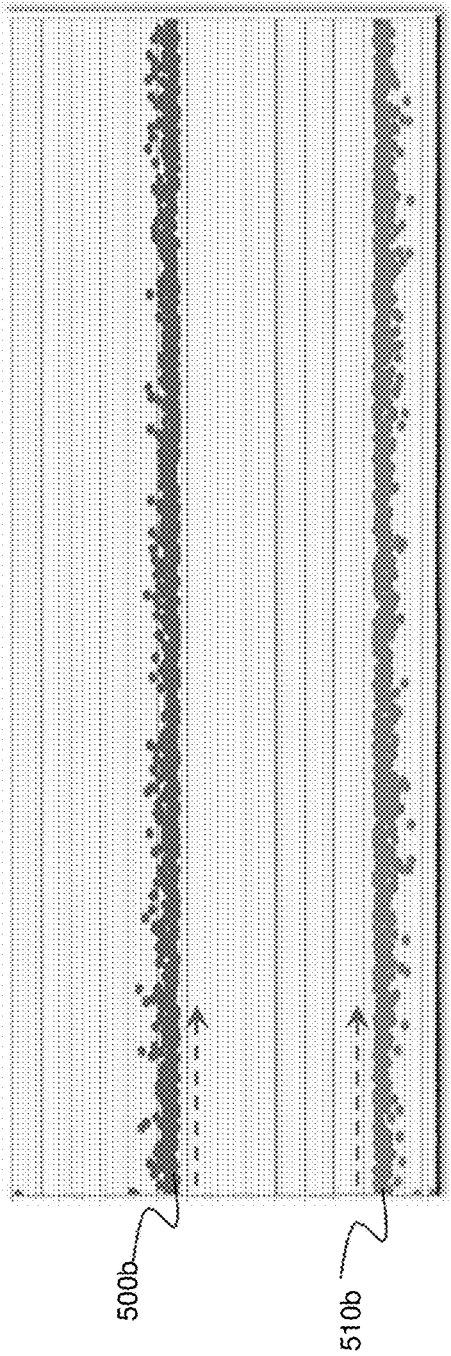

FIGS. 5A and 5B illustrate the results of program/erase cycles of a known approach and using the self-heating approaches described herein. Specifically, FIG. 5A shows a graph of known approaches (i.e., bias only erase approach); whereas, FIG. 5B shows the benefits of the erase operation provided by the structures and processes described herein.

In FIG. 5A, line 500a represents post program device threshold voltages, while line 510a represents the post erase device threshold voltages. As shown in FIG. 5A, the memory window is shown as a space between line 510a and the reference threshold voltage is the first point on line 500a. As shown, a "walk up" of the post erase and post program device threshold voltages will cause the memory window to narrow down (i.e. increase in post program device threshold voltages), until eventually the post erase device threshold voltage represented in line 510a is equal to or greater than the reference threshold voltage represented by line 500a, i.e., until the memory window has completely collapsed. This will prevent the ability to distinguish between the programmed and erased devices, leading to a premature failure and limited endurance.

In comparison, in FIG. 5B, line 500b represents the post program device threshold voltages, while line 510b represents the post erase device threshold voltages. As shown in FIG. 5B, the window between lines 500b, 510b remains flat, indicating there is no "walk up" of the post erase device threshold voltages. This allows for the endurance of the device to increase to greater than 1000× program/erase cycles. In this way, the structures and processes described herein provide significant improvement in memory window walk-up, endurance and yield (e.g., 100% yield for 1000 program/erase (P/E) cycles).

Figure 6:
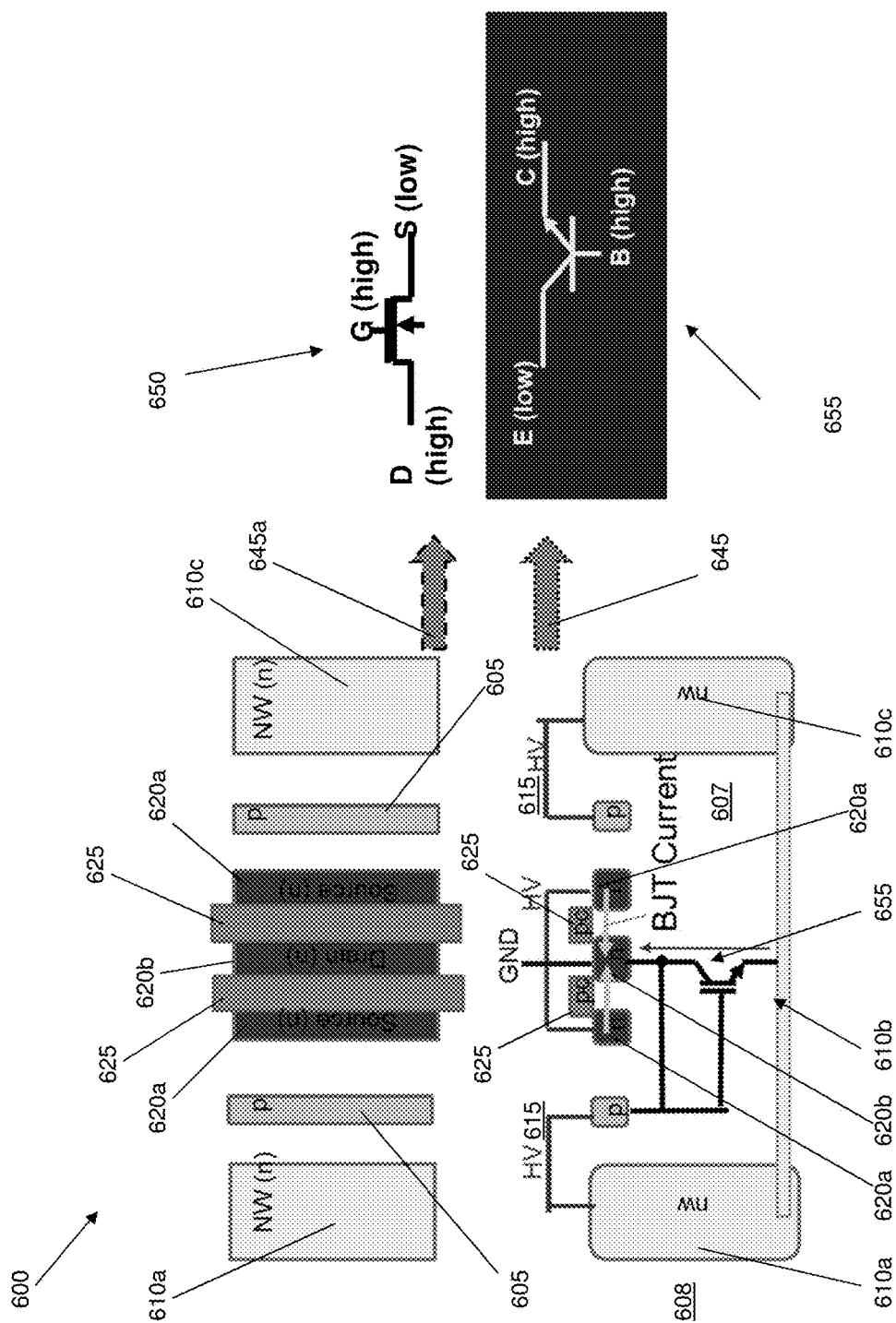
FIG. 6 shows an alternative CTT memory structure utilizing the source-substrate-drain structure of the device as a parasitic (n-p-n) bipolar junction transistor (BJT), amongst other features, in accordance with aspects of the present disclosure.

FIG. 6 shows an alternative CTT memory structure 600 having an N-type-Metal-Oxide-Semiconductor Field-Effect-Transistor (N-type MOSFET) as a charge trap transistor (CTT) for erase operations 645 and program operations 645a in accordance with aspects of the present disclosure. Similar to the structure of FIG. 1, the CTT memory structure (cell) 600 employs an N-type MOSFET structure as a charge trap transistor, which employs self-heating assist to improve the programming and erase efficiency within an embedded non-volatile memory (eNVM).

The CTT memory structure 600 includes a p+ diffusion 605 for coupling to the p-well substrate, which creates deep n-wells 610a and 610c and 610b to isolate the p-well substrate 607 from the bulk substrate 608 for other circuits. In embodiments, the CTT memory structure 600 comprises an N-type MOSFET structure 650 having a gate structure 625, a n-doped diffusion source region 620a, and a n-doped diffusion drain region 620b, and a p-doped substrate 607. The CTT memory structure 600 also configures a n-p-n BJT structure 655 using the N-type MOSFET's n-doped diffusion source region 620a as an emitter, the n-doped diffusion drain region 620b as a collector and the p-well substrate 607 coupling to the p+ diffusion 605 as a base. In this embodiment, the source region 620a is an unshared diffusion. In embodiments, a triple well, i.e., n-wells 610a, 610c, and the n-plate 610b, isolates the p-well substrate 607 from bulk p substrate 608 for biasing. In this way, the source, i.e., source region 620a, and the drain, i.e., drain region 620b, are n-doped and the p-well 607 is p-doped to form an n-p-n junction transistor, i.e., n-p-n BJT structure 655.

The CTT memory structure 600 further includes an isolated p-doped diffusion (p-well) 615 to isolate the p-well 607 from the bulk p-substrate 608 used for other circuitry. The isolated p-well 607 is realized by using deep n-wells 610a and 610c in a perimeter of the p-doped diffusion (p-well) 615, and the n-plate 610b at the bottom of the p-well 607. This allows the p-well substrate 607 as a MOS or a base of an n-p-n BJT structure 655 to be biased to the target voltage without effecting other circuits. Further, a gate structure 625 and a corresponding gate dielectric are formed over the substrate 607.

In embodiments, the CTT memory structure 600 reverses the drain and source bias, i.e., drain 620*b*=low and source 620*a*=high, for erase operations. For programming operations, the opposite is true, i.e., drain 620*b*=high and source 620*a*=low. Reversing the drain and source bias results in a significant reduction in the n-p-n current. Reversing of the bias is achieved by operating the Source/Subs/Drain structure of the CTT memory structure 600 as a parasitic BJT such that the high bias nodes are flipped during the erase operation with respect to the program operation. The unshared diffusions are biased high instead of the shared diffusions.

Continuing with FIG. 6, for the erase operation 645, the NMOS transistor 655 of the CTT memory structure 600 is deeply OFF by raising source (S) 620*a* to ~2V, while keeping gate (G) 625 and drain (D) 620*b* at a low voltage (0V). When the p-well SUB (base) 607 coupling to the p+ diffusion 605 is raised to the high voltage, the parasitic n-p-n BJT is ON because the drain (emitter) 120*b* is at the low voltage (0V), and the source (collector) 620*a* is at high voltage (~2V), flowing the high current from source (collector) 620*a* to the drain (emitter) 620*b*. Further, the MOS 655 is deeply OFF because the gate 625 is at a low voltage (0V), enabling both a voltage and a self-heating erase at the same time.

By using the source 620*a*, which is an unshared diffusion, as a collector during the erase, the BJT current is eliminated from the n-wells 610*a*, 610*c*. This results in a reduction of power needed for program and erase operations. Specifically, n-p-n current from the n-wells 610*a*, 610*c* can be eliminated, resulting in more efficient power and erase operations. Further, the unshared diffusion regions, i.e., source 620*a*, at a low voltage during programming, improves the programming efficiency. This is due to current of the NMOS transistor being more sensitive for a low voltage. Additionally, reversing the current direction change between erase operations 645 and program operations 645*a* eliminates the tungsten (W) migration issue (i.e., better condition for electrical migration). In addition, reversing the voltage direction with respect to the programming operation 645*a* improves the efficiency of the charge detrapping, because the CTT charge distribution is somewhat skewed toward the source side (using high voltage for higher trapping side i.e., source side is better for the erase).

Figure 7A:
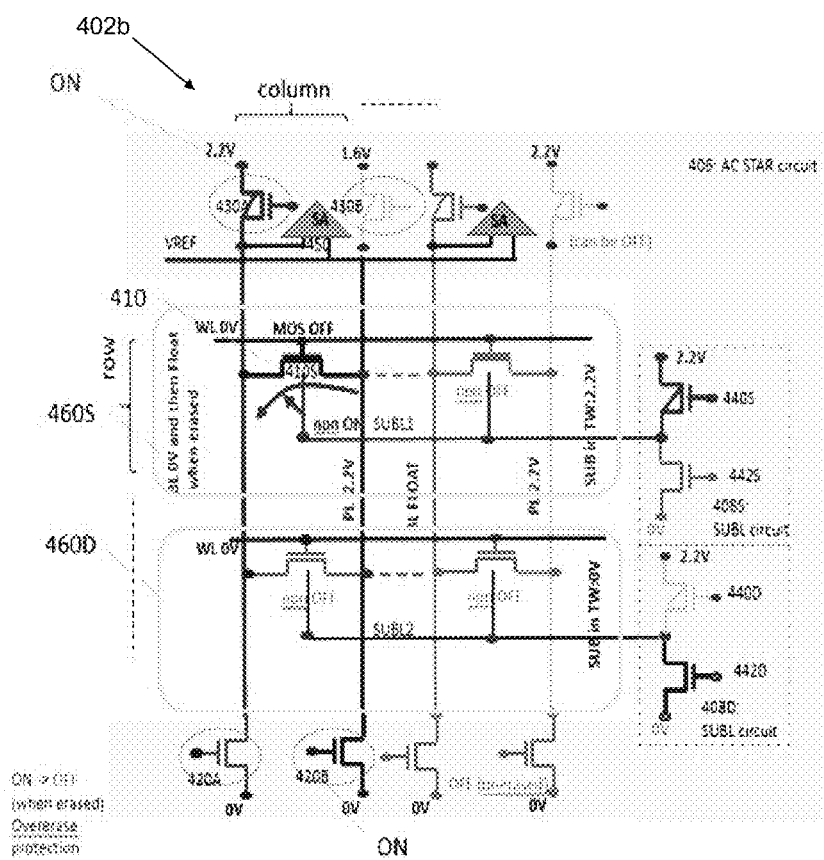
FIGS. 7A and 7B show memory cells and the respective control circuit structures for erase and program operations of the CTT memory structure of FIG. 6, in accordance with aspects of the present disclosure.
Figure 7A:
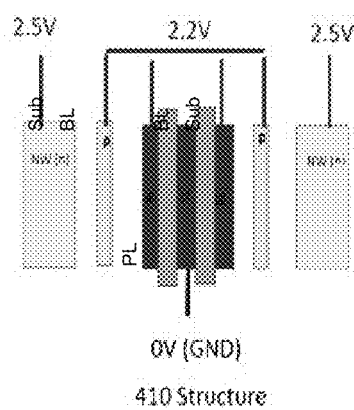
Figure 7B:
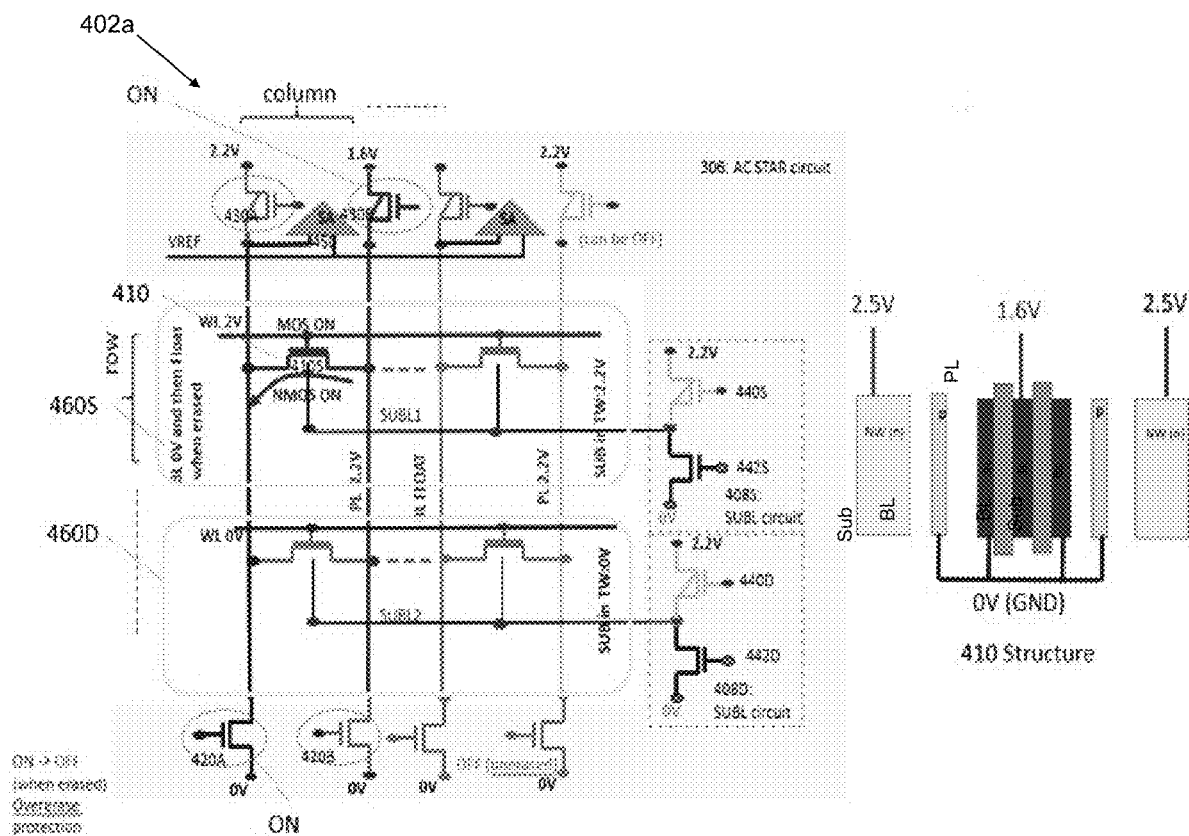

FIGS. 7A and 7B show erase operations 645 and program operations 645*a* for the CTT memory structure 600 of FIG. 6, in accordance with aspect of the present disclosure. In FIG. 7A, for erase operations, the CTT memory cells 410, i.e., the CTT memory structure 600, are arranged in a 2D matrix, with the BL and the PL coupling to the target cell 410S. In embodiments, the BL is pulled up (2.2V) and the PL is pulled down (0V), using the corresponding PMOS transistor 430A and NMOS transistor 420B. Further, the WL is set at GND and the corresponding substrate line (SUBL1) coupled to the target cell 410S is raised by using the transistors 440S, 442S of the circuit 408S. In embodiments, SUBL1 is raised to 2.2V, such that the target CTT cell 412S detraps the changes by using the BJT current. As shown in the 410 structure, in embodiments, the BL and the PL are assigned to 2.2V using an unshared diffusion and 0V using shared diffusion regions of the two (or more even number) fingered MOS structure 655 (FIG. 6), and the selected p-well substrate (SUB1) is raised to 2.2V, while keeping the unselected p-well substrate (SUB2) at 0V.

In FIG. 7B, for program operations, the CTT memory cells 410 are arranged in a 2D matrix. For programming, the WL coupled to the target cell 410S is raised to 2V, and the BL and PL coupled to the target cell 410S are pulled down (0V) and up (1.6V), using the corresponding NMOS transistor 420A and PMOS transistor 430B such that the target CTT 410S traps the changes by using a self-heating effect due to the MOS current. As shown in the structure 410, in embodiments, the BL and PL are assigned to 0V using the unshared diffusion and 1.6V using the shared diffusion regions of the two (or more even number) fingered MOS structure 655 (FIG. 6), and the all p-well substrate (SUB) are kept at 0V.

The CTT technologies described herein are fully logic-compatible (process and operation) with embedded Multi-Time-Programmable-Memory (MTPM) solutions for CMOS technologies and system-on-chip (SoC) products. The self-heating approach is particularly advantageous for embedded applications, including hardware and data security. Specifically, these applications include system-on-chip (SoC), large integrated ASICS, data security enhancements (e.g., passwords), on-chip reconfigurable encryption key storage, firmware storage, chip IDs, performance tailoring, configuration files, repair data and field configurability, amongst other examples that benefit from re-writable non-volatile memory.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on semiconductor (such as silicon) wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

The method(s) as described above is (are) used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor memory, comprising:
   a charge trap transistor comprising a gate structure, a source region, a bitline (BL), a word line (WL), and a drain region;
   a self-heating circuit which selectively applies an alternating bias direction between the source region and the drain region of the charge trap transistor to provide an erase operation or a programming operation of the charge trap transistor; and
   a substrate-line (SUBL) circuit comprising a plurality of transistors and a substrate-line (SUBL), the SUBL being different from the BL and the WL of the charge trap transistor,
   wherein, during the erase operation, trapped electrons within a gate dielectric of the charge trap transistor are de-trapped by raising the SUBL to a high voltage using the plurality of transistors of the SUBL circuit.

2. The semiconductor memory of claim 1, wherein the charge trap transistor further comprises a substrate, wherein the source region is an emitter, the drain region is a collector and the substrate is a base of a bipolar junction transistor (BJT).

3. The semiconductor memory of claim 2, wherein the substrate comprises a p-doped substrate and a bulk p-substrate, the p-doped substrate is isolated from the bulk p-substrate for other devices.

4. The semiconductor memory of claim 2, wherein the source region and the drain region are n-doped and the substrate is p-doped to form an n-p-n junction transistor.

5. The semiconductor memory of claim 2, wherein the self-heating circuit selectively applies voltages to the gate structure to assist in the programming operation of the charge trap transistor.

6. The semiconductor memory of claim 2, wherein the source region and the drain region are p-doped and the substrate is n-doped to form a p-n-p junction transistor.

7. The semiconductor memory of claim 2, wherein the SUBL is connected to the substrate, the WL is connected to the gate structure, the BL is connected to the source region and a programming-line (PL) connected to the drain region, wherein the self-heating circuit comprises another plurality of transistors which selectively apply voltages to the SUB line, the WL, the BL and the PL.

8. The semiconductor memory of claim 1, wherein in the erase operation, the self-heating circuit alternates the drain region between a first voltage and a second voltage.

9. The semiconductor memory of claim 8, wherein the first voltage is high and the second voltage is low, the first voltage is a positive voltage, and the second voltage is below the first voltage.

10. The semiconductor memory of claim 1, wherein a channel region under the gate structure is self-heated by n-p-n current flowing from the drain region to the source region or vice versa and also enables a deep-off state of the charge trap transistor.

11. The semiconductor memory of claim 10, wherein during the erase operation, an n-doped source of the source region is an emitter node and an n-doped drain of the drain region is a collector node of the charge trap transistor.

12. A semiconductor memory, comprising:
    a charge trap transistor comprising a plurality of source regions, a bitline (BL), a word line (WL), and a drain region and a plurality of doped wells;
    a self-heating circuit is configured to selectively apply a bias in a first direction and a second, reverse direction to the source regions and the drain region to assist in an erase operation or a program operation of the charge trap transistor; and
    a substrate-line (SUBL) circuit comprising a plurality of transistors and a substrate-line (SUBL), the SUBL being different from the BL and the WL of the charge trap transistor,
    wherein, during the erase operation, trapped electrons within a gate dielectric of the charge trap transistor are de-trapped by raising the SUBL to a high voltage using the plurality of transistors of the SUBL circuit.

13. The semiconductor memory of claim 12, wherein in the erase operation, the self-heating circuit is configured to reverse the drain region to a low voltage, and the low voltage is below a positive voltage.

14. The semiconductor memory of claim 12, wherein, in the erase operation, the self-heating circuit is configured to reverse the source region to a high voltage, and the high voltage is a positive voltage.

15. The semiconductor memory of claim 12, wherein the self-heating circuit is configured to place the charge trap transistor in an OFF mode by raising the source to a high voltage while keeping the drain at a low voltage.

16. The semiconductor memory of claim 12, wherein the self-heating circuit is configured to skew a charge distribution to the source region by reversing the direction of the bias.

17. A semiconductor memory cell, comprising:
    a Metal-Oxide-Semiconductor Filed-Effect Transistor (MOSFET) comprising a substrate, a gate structure, a high-k dielectric material under the gate structure, a source region, a bitline (BL), a word line (WL), and a drain region;
    a self-heating circuit is configured to apply a bias to the substrate, the high-k dielectric metal gate structure, the source region and the drain region; and
    a substrate-line (SUBL) circuit comprising a plurality of transistors and a substrate-line (SUBL), the SUBL being different from the BL and the WL of the charge trap transistor,
    wherein the high-k dielectric of the high-k dielectric metal gate structure releases a trapped charge when a bias direction applied to the MOSFET is alternated between the source region and the drain region, and
    during the erase operation, trapped electrons with a gate dielectric of the charge trap transistor are de-trapped by raising the SUBL to a high voltage using the plurality of transistors of the SUBL circuit.

18. The semiconductor memory of claim 17, wherein the self-heating circuit alternates the drain region between a first voltage and a second voltage, the second voltage is a positive voltage, and the first voltage is below the second voltage.

19. The semiconductor memory of claim 17, wherein the self-heating circuit further generates an electric field from the bias, and the self-heating circuit is further is configured to alternate a direction of the electric field between the source region and the drain region during a programming operation.

20. The semiconductor memory of claim 17, further comprising a triple well which isolates the p-doped substrate for biasing, and the triple well comprising an n-plate and two n-wells.

* * * * *